(12) United States Patent
Watkins et al.

(10) Patent No.: US 6,538,441 B1
(45) Date of Patent: Mar. 25, 2003

(54) RF COIL FOR REDUCED ELECTRIC FIELD EXPOSURE FOR USE IN VERY HIGH FIELD MAGNETIC RESONANCE IMAGING

(75) Inventors: Ronald Dean Watkins, Niskayuna, NY (US); John Frederick Schenck, Voorheesville, NY (US); Randy Otto John Giaquinto, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/682,741

(22) Filed: Oct. 12, 2001

(51) Int. Cl.⁷ .................................................. G01V 3/00
(52) U.S. Cl. ........................ 324/318; 324/309; 324/300
(58) Field of Search ................................. 324/318, 322, 324/300, 306, 307, 309; 600/423, 424

(56) References Cited

U.S. PATENT DOCUMENTS

| | | | |
|---|---|---|---|
| 4,667,159 A | 5/1987 | Hodsoll, Jr. et al. | 324/309 |
| 4,680,548 A | 7/1987 | Edelstein et al. | 324/318 |
| 4,689,563 A | 8/1987 | Bottomley et al. | 324/309 |
| 4,885,539 A | * 12/1989 | Roemer et al. | 324/318 |
| 6,249,121 B1 | 6/2001 | Boskamp et al. | 324/318 |

FOREIGN PATENT DOCUMENTS

EP 1 087 234 A * 3/2001

* cited by examiner

Primary Examiner—Edward Lefkowitz
Assistant Examiner—Brij B. Shrivastav
(74) Attorney, Agent, or Firm—Jean K. Testa; Patrick K. Patnode

(57) ABSTRACT

A radio frequency (RF) coil assembly for a very high field Magnetic Resonance Imaging (MRI) system is provided. The RF coil assembly comprises a plurality of conductors arranged cylindrically and disposed about a patient bore tube of the MRI system. Each of the conductors is configured for the RF coil assembly to resonate at substantially high frequencies. Further, the RF coil assembly comprises a plurality of capacitive elements disposed between and connecting respective ends of the conductors and further disposed in a spaced-apart relationship with the patient bore tube. The capacitive elements are for electrically interconnecting the plurality of conductors at the respective ends of the conductors.

8 Claims, 5 Drawing Sheets

RF COIL FOR REDUCED ELECTRIC FIELD EXPOSURE FOR USE IN VERY HIGH FIELD MAGNETIC RESONANCE IMAGING

BACKGROUND OF INVENTION

This invention relates to a Magnetic Resonance Imaging (MRI) apparatus. More particularly, this invention relates to radio frequency (RF) coils useful with such apparatus for transmitting and/or receiving RF signals.

MRI scanners, which are used in various fields such as medical diagnostics, typically use a computer to create images based on the operation of a magnet, a gradient coil assembly, and a radiofrequency coil(s). The magnet creates a uniform main magnetic field that makes nuclei, such as hydrogen atomic nuclei, responsive to radiofrequency excitation. The gradient coil assembly imposes a series of pulsed, spatial magnetic fields upon the main magnetic field to give each point in the imaging volume a spatial identity corresponding to its unique set of magnetic fields during the imaging pulse sequence. The radiofrequency coil(s) creates an excitation frequency pulse that temporarily creates an oscillating transverse magnetization that is detected by the radiofrequency coil and used by the computer to create the image.

Generally, very high field strength is characterized as greater than 2 Tesla (2 T). In recent years, there has been an increase in usage of MRI systems at field strengths above the typical 1.5 Tesla. Research systems have been built as high as 8 Tesla. Systems are now commercially available at 3 Tesla and 4 Tesla. The systems are primarily used for research in function MRI (fMRI) and human head related imaging and spectroscopy studies. Higher magnetic field strength imposes challenges on the RF coil, such as balancing inductance and capacitance at higher frequencies (greater than the typical 64 MHz). At very high magnetic fields, and therefore very high Larmor frequencies, standard birdcage coils with moderately narrow rung copper strips will have relatively high inductance requiring very low capacitor values in order to resonate the coil. This is problematic for a number of reasons. Firstly, high currents through small value capacitors will have very high voltage potential across them which can then have a local stray electric field that can dissipate RF power in the form of heat in an imaging subject.

The U.S. Food and Drug Administration (FDA) has imposed limits, referred to as Specific Absorption Rate (SAR), on the level of electromagnetic energy which can be absorbed by a patient or medical personnel during MRI scanning. These limits help reduce the risk of RF induced burn on the patient, or imaging subject. There are two types of electric fields associated with MRI. The first is due to time-varying B1 magnetic field present within the imaging subject and the second type is due to electric charges on the capacitors in the RF coil structure.

What is needed is a RF coil assembly for MR imaging at high magnetic field strengths and reduced electromagnetic energy exposure to the imaging subject.

SUMMARY OF INVENTION

A radio frequency (RF) coil assembly for a very high field Magnetic Resonance Imaging (MRI) system is provided. The RF coil assembly comprises a plurality of conductors arranged cylindrically and disposed about a patient bore tube of the MRI system. Each of the conductors is configured for the RF coil assembly to resonate at substantially high frequencies. Further, the RF coil assembly comprises a plurality of capacitive elements disposed between and connecting respective ends of the conductors and further disposed in a spaced-apart relationship with the patient bore tube. The capacitive elements are for electrically interconnecting the plurality of conductors at the respective ends of the conductors.

BRIEF DESCRIPTION OF DRAWINGS

The features and advantages of the present invention will become apparent from the following detailed description of the invention when read with the accompanying drawings in which.

DETAILED DESCRIPTION

Figure 1:
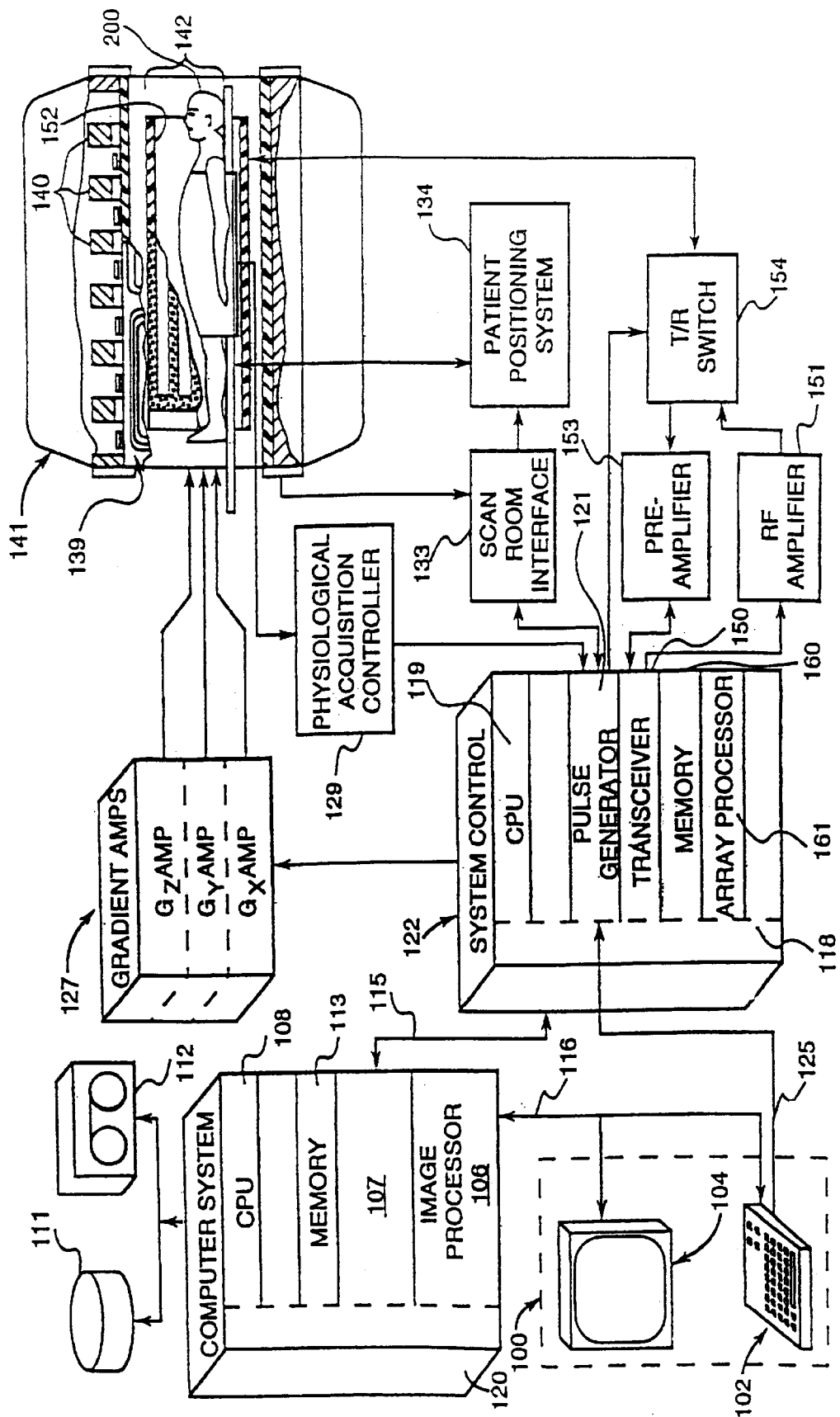
FIG. 1 illustrates a simplified block diagram of a Magnetic Resonance Imaging system to which embodiments of the present invention are useful.

FIG. 1 illustrates a simplified block diagram of a system for producing images in accordance with embodiments of the present invention. In an embodiment, the system is a MR imaging system which incorporates the present invention. The MRI system could be, for example, a GE-Signa MR scanner available from GE Medical Systems, Inc., which is adapted to perform the method of the present invention, although other systems could be used as well.

The operation of the MR system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108, and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data that indicate the timing, strength, and shape of the radio frequency (RF) pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives subject data from a physiological acquisition controller 129 that receives signals from a number of different sensors connected to the subject 200, such as ECG signals from electrodes or respiratory signals from a bellows. And finally, the pulse generator module 121 connects to a scan room interface circuit 133 which receives signals from various sensors associated with the condition of the subject 200 and the magnet system. It is also through the scan room interface circuit 133 that a positioning device 134 receives commands to move the subject 200 to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. Volume 142 is shown as the area within magnet assembly 141 for receiving subject 200 and includes a patient bore. As used herein, the usable volume of a MRI scanner is defined generally as the volume within volume 142 that is a contiguous area inside the patient bore where homogeneity of main, gradient and RF fields are within known, acceptable ranges for imaging. A transceiver module 150 in the system control 122 produces pulses that are amplified by an RF amplifier 151 and coupled to the RF coil 152 by a transmit/receive switch 154. The resulting signals radiated by the excited nuclei in the subject 200 may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode. Embodiments of RF coil 152 will be discussed further with reference to FIG. 2. As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that is programmed to perform a sequel to provide an output in response to given input signals.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. These image data are conveyed through the serial link 115 to the computer system 107 where they are stored in the disk memory 111. In response to commands received from the operator console 100, these image data may be archived on the tape drive 112, or they may be further processed by the image processor 106 and conveyed to the operator console 100 and presented on the display 104. It is to be appreciated that a MRI scanner is designed to accomplish field homogeneity with given scanner requirements of openness, speed and cost.

As used herein, the term "very high field" refers to magnetic fields produced by the MRI system that are greater than about 2 Tesla. For embodiments of the invention the high field is desirably 3 Tesla. Also, as used herein, "very high frequency" is considered to be the range of about 64 MHz to about 500 MHz, with a desired range between about 128 MHz and 300 MHz. For embodiments of the invention, the high frequency is desirably at about 128 MHz. Imaging at very high fields and very high frequencies is particularly useful for cardiac, spine and extremity imaging.

Figure 2:
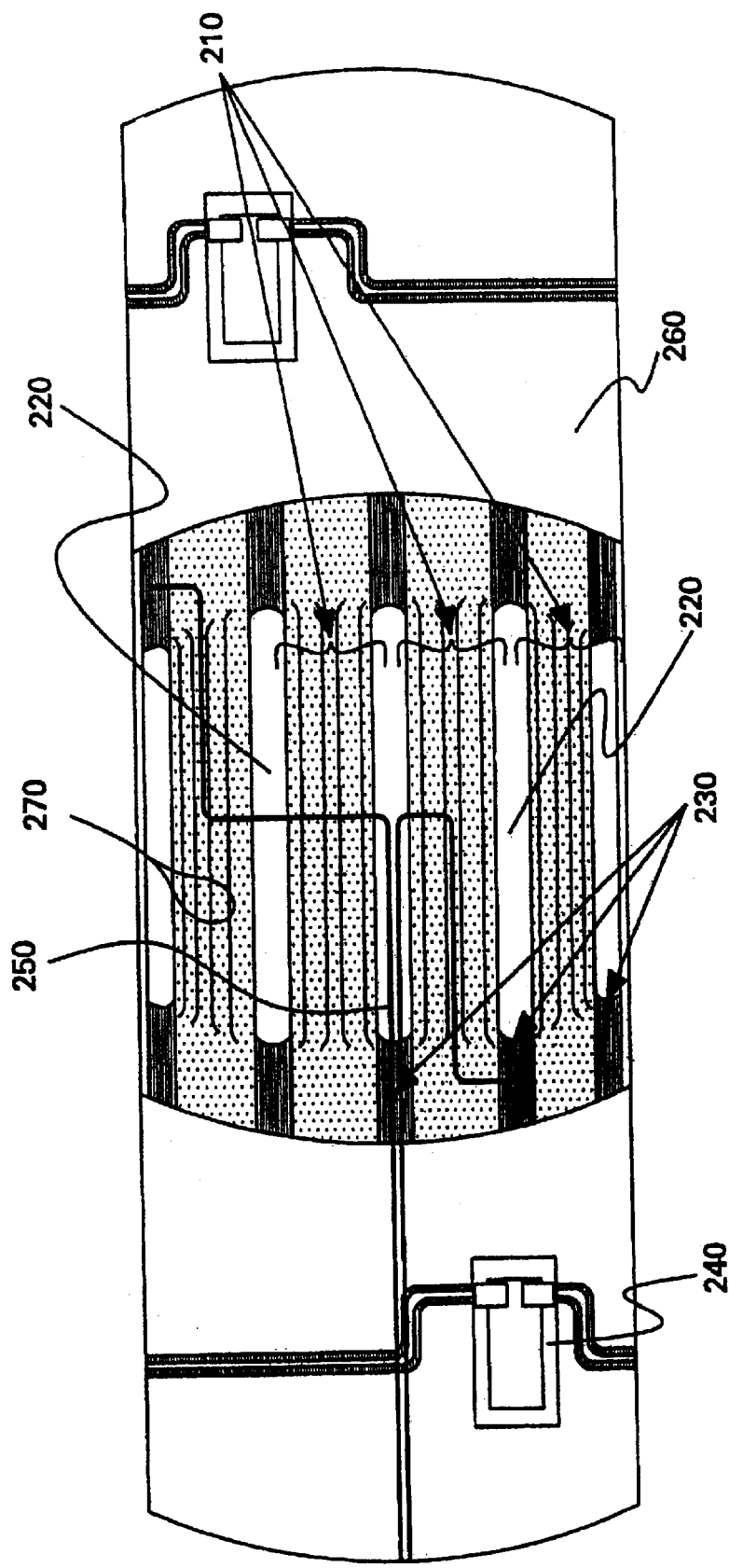
FIG. 2 is a schematic illustration of a radio frequency (RF) coil assembly to which embodiments of the present invention are applicable.

Referring to FIG. 2, an embodiment of a radio frequency (RF) coil assembly for a very high field MRI system is shown. In this embodiment, a RF coil assembly comprises a plurality of conductors 210 that are arranged cylindrically and disposed about a cylindrical patient bore tube 260. The plurality of conductors define a cylindrical imaging volume into which a subject to be examined is subjected to a RF field produced by the coil. Conductors 210 are constructed from conventional materials such as copper or copper that is plated with silver or other metals known in the art. The thickness of conductors is selected in accordance with conventional thicknesses. The RF coil assembly further comprises a plurality of capacitive elements 230, such as low inductance end ring capacitors (loops), serially coupled to the conductors and for electrically interconnecting conductors 210 to one another at respective ends of conductors 210. Conductors 210 have a selected width to reduce inductance at substantially high frequencies. The selection of conductor width will be discussed in greater detail below. Disposed between the respective conductors 210 are gaps 220 that provide spacing between the conductors. The spacing is variable depending on the width of the conductors, which will be discussed further below. For purposes of the invention, the RF coil assembly comprises conductors 210, gaps 220 and capacitive elements 230, which will be described in greater detail below.

Referring further to FIG. 2, conductors 210 are shown as substantially identical segments cylindrically arranged, and longitudinally relative to one another, and disposed about patient bore tube 260. Patient bore tube 260 is of a type used in conventional MRI systems, and typically is constructed of fiberglass. Conductors 210 are electrically interconnected in adjacent pairs at each end of the respective conductor pairs by capacitive elements 230. Capacitive elements 230 are desirably low inductance end ring capacitors known in the art. The value of capacitive elements is selected based on known computations depending on the operating parameters of the desired frequency and magnetic field strength. The resulting assembly of conductors and capacitive elements forms a plurality of conductive loops for producing the RF field used in the MRI system for imaging.

Figure 4:
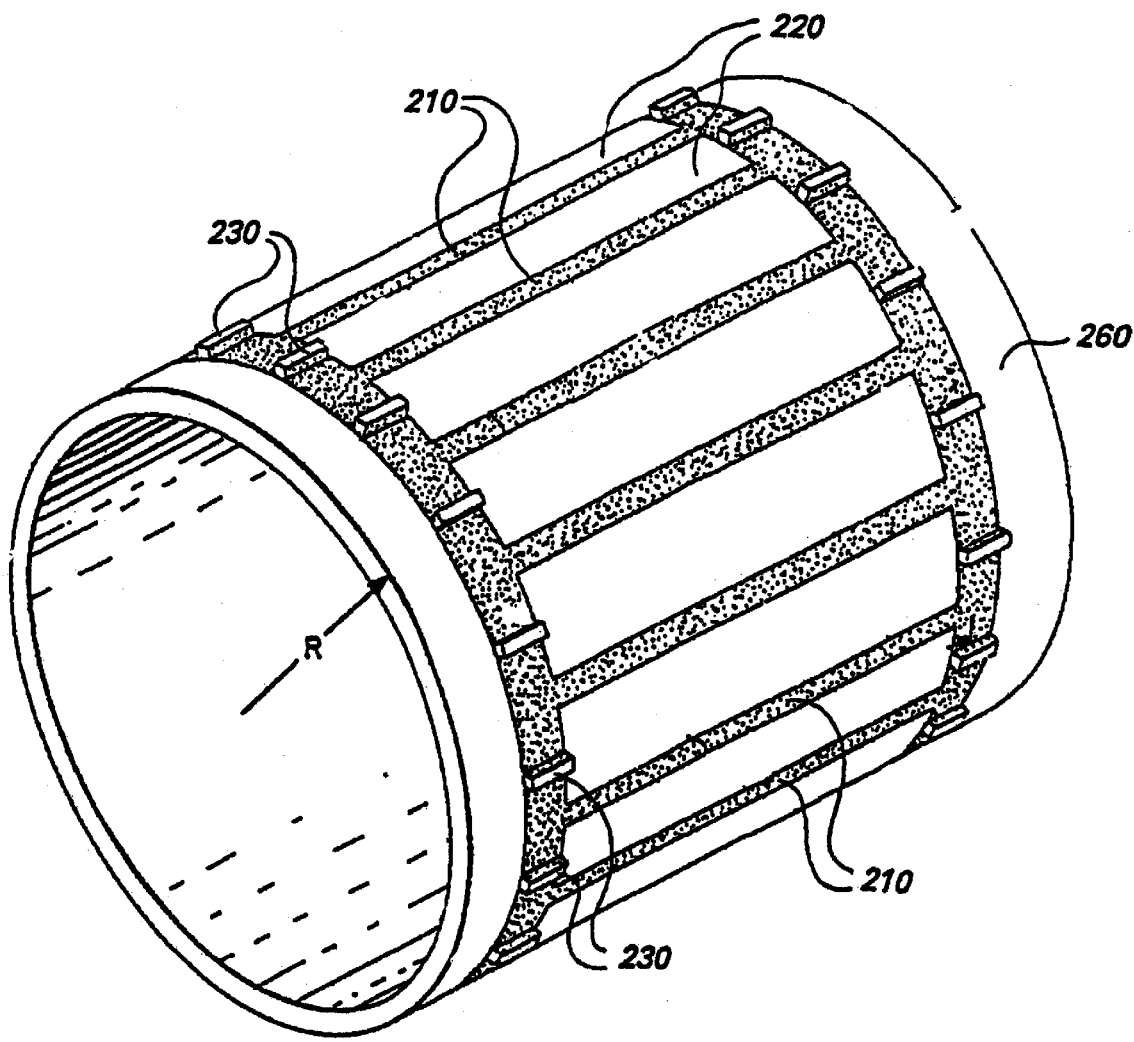
Figure 5:
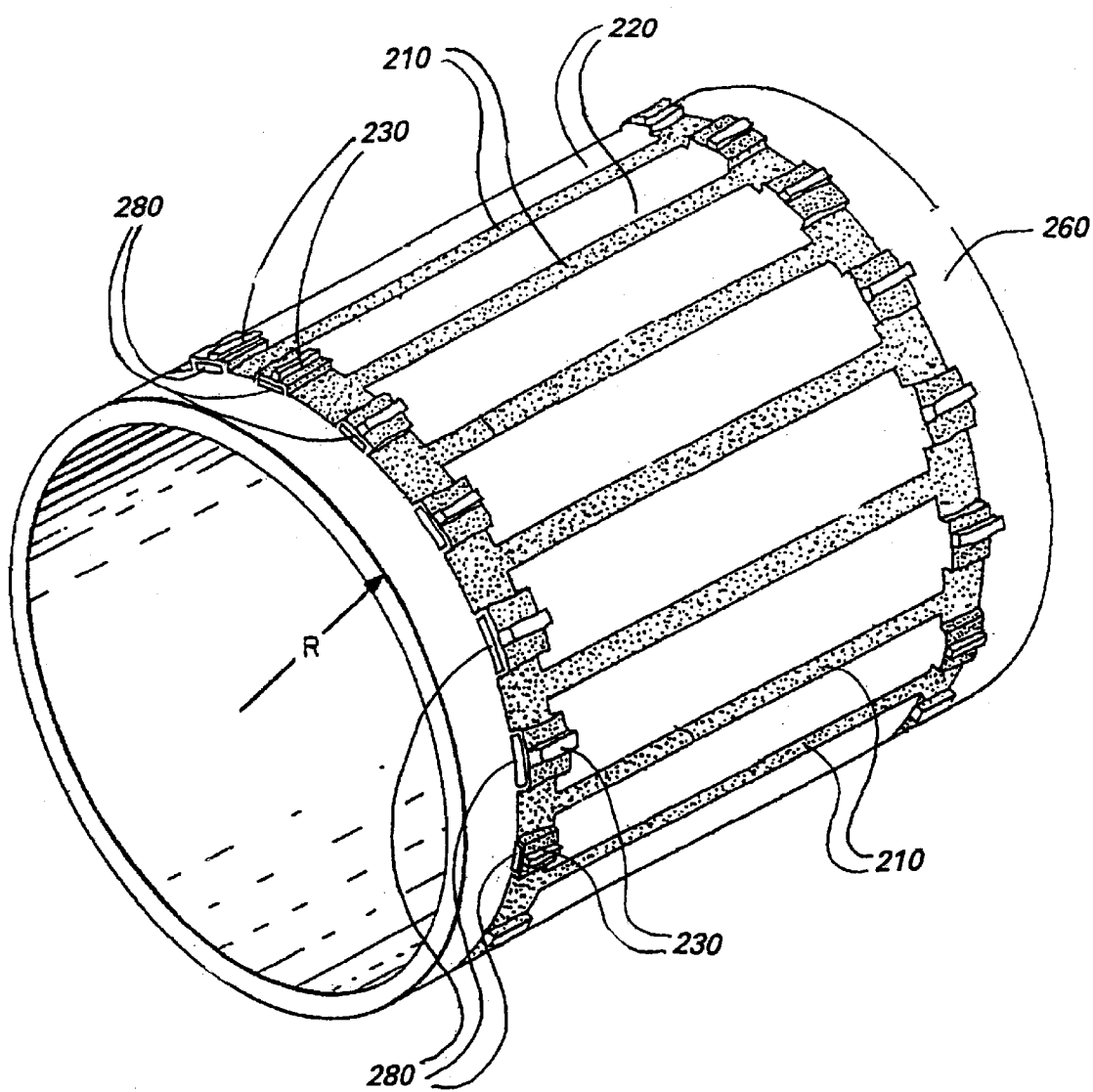

In an embodiment of the present invention, capacitive elements 230 are disposed in a spaced apart relationship from patient bore tube 260 to substantially minimize the amount of electromagnetic energy absorbed by the imaging subject, as well as by the medical personnel operating the MRI system. Referring to FIG. 4, there is shown an illustration of the RF coil assembly as described above having a plurality of conductors 210, gaps 220 and capacitive elements 230 arranged about patient bore tube 260 in a high band pass configuration. An embodiment of the present invention is shown in FIG. 5. Referring to FIG. 5, in which similar reference numbers of FIG. 4 refer to the similar components, there is further provided a plurality of separating blocks 280. In this embodiment, separating blocks 280 maintain a spaced apart relationship between capacitive elements 230 and patient bore tube 260. Additionally, separating blocks 280 reduce the electromagnetic energy, or alternatively electric field, exposure to the imaging subject.

Separating blocks 280 increase the distance from capacitive elements 230 to patient bore tube 260 on which the RF coil assembly is constructed, as well as increasing the distance from capacitive elements 230 to imaging subject 200 (FIG. 1) inside patient bore tube 260. Stray electric field intensity is a function of distance. By employing separating blocks 280, the increased distance that is realized serves to reduce the electric field exposure to imaging subject 200 (FIG. 1) and also reduces the resulting local heating caused by electric field exposure from the capacitors. Separating blocks 280 are desirably constructed from a dielectric material such as teflon or plastic. In an alternative embodiment, separating blocks 280 are air gaps providing a metallic lead configuration that stands capacitive elements 230 off a distance from patient bore tube 260. Further embodiments comprise mechanical separating devices or spacers that do not interfere with the electrical requirements of the MRI system. Desirably, the distance provided by separating blocks is about 3 mm to about 10 mm. This desirable distance refers to the approximate height of a teflon or plastic block, or alternatively the height of the air gap.

In further embodiments, the RF coil assembly is a bird cage configuration that has been modified to provide a distance between the end ring capacitors and the patient bore tube of a MRI system.

The length of conductors 210 is selected based upon the desired imaging application and power considerations. The power requirements are directly related to the length of the conductors the shorter the conductor length, the lower the power requirements. Conversely, a longer conductor length enables a larger field of view (FOV). The maximum length of the conductors cannot exceed the length of the patient bore tube 260. It is to be appreciated that one skilled in the art would determine the length of conductors 210 in accordance with established computations to accomplish the desired imaging application and power requirements. Conductor length also contributes inductance. In an exemplary embodiment, conductor length was selected to be about 50 cm for a patient bore tube having a length of about 94 cm. Also, in an exemplary embodiment, the outer diameter of the patient tube was about 55.7 cm. Also, in a further exemplary embodiment, the inner diameter of the patient tube is desirably between about 55 cm to about 60 cm in order to provide a volume that is suitable for imaging a human body.

As is well-known, frequency f is a function of inductance L and capacitance C, and is commonly expressed as:

$$f = \frac{1}{2}\pi\sqrt{LC}$$

In order for the RF coil assembly of the present invention to resonate at very high frequencies in very high field MRI systems, conductor width is desirably selected to be substantially wide (wider than conventional MRI systems operating at less than 2 Tesla) in order to minimize inherent inductance.

In an embodiment, the width of the conductors is selected according to the equation:

$$w_{max} = 2\pi * A/N$$

where $w_{max}$ is the maximum width of conductors 210, A is the outer diameter radius of patient bore tube 260 and N is the number of conductors. As indicated by the above equation, the width of conductors 210 is dependent on the number of conductors. Desirably, the number of conductors is 16 to obtain acceptable high resolution images. However, it is to be appreciated that one skilled in the art knows that the number of conductors is selectable based on considerations such as image resolution, power requirements, and imaging speed.

The number of capacitive elements 230 is directly related to the number of conductors. As discussed above, capacitive elements 230 connect adjacent conductors 210 in pairs to electrically interconnect all of the conductors to form a conductive loop for producing the RF field in the MRI system. Thus, desirably for 16 conductors there are 32 capacitive elements.

Conductors 210 are spaced apart by gaps 220. As discussed above, the widths of gaps 220 is dependent on the widths of conductors 210. The respective widths of gaps 220 and conductors 210, as cylindrically arranged about the patient bore tube, will total the outer diameter of the patient bore tube.

In a further embodiment, conductors 210 further comprises segment slots 270 which are provided in a known manner to substantially eliminate eddy currents induced by gradient coils (139 of FIG. 1) of the MRI system.

In another embodiment, a very high field MRI system comprises a RF coil assembly adapted to resonate at substantially high frequencies, a RF coil shield assembly and a plurality of RF drive power cables. Referring further to FIG. 2, an embodiment of a MRI system comprises a RF coil assembly as described above, RF drive cables 250, dynamic disable circuits 240 and a RF coil shield assembly which will be discussed with reference to FIG. 3. Dynamic disable circuits 240 are employed to deresonate the RF coil assembly during head and/or surface coil operation, as required. One or more disable circuits 240, of a conventional pin-diode type, are employed. In an exemplary embodiment, 8 disable circuits were used. RF drive cables 250 are an arrangement of multiple coaxial cable connections adapted to electrically connect to the RF coil assembly at one of capacitive elements 230 without need for any isolation means, such as conventional RF baluns. An example of a RF drive cable useful in this embodiment is described by U.S. Pat. No. 4,887,039 to Roemer et al.

Figure 3:
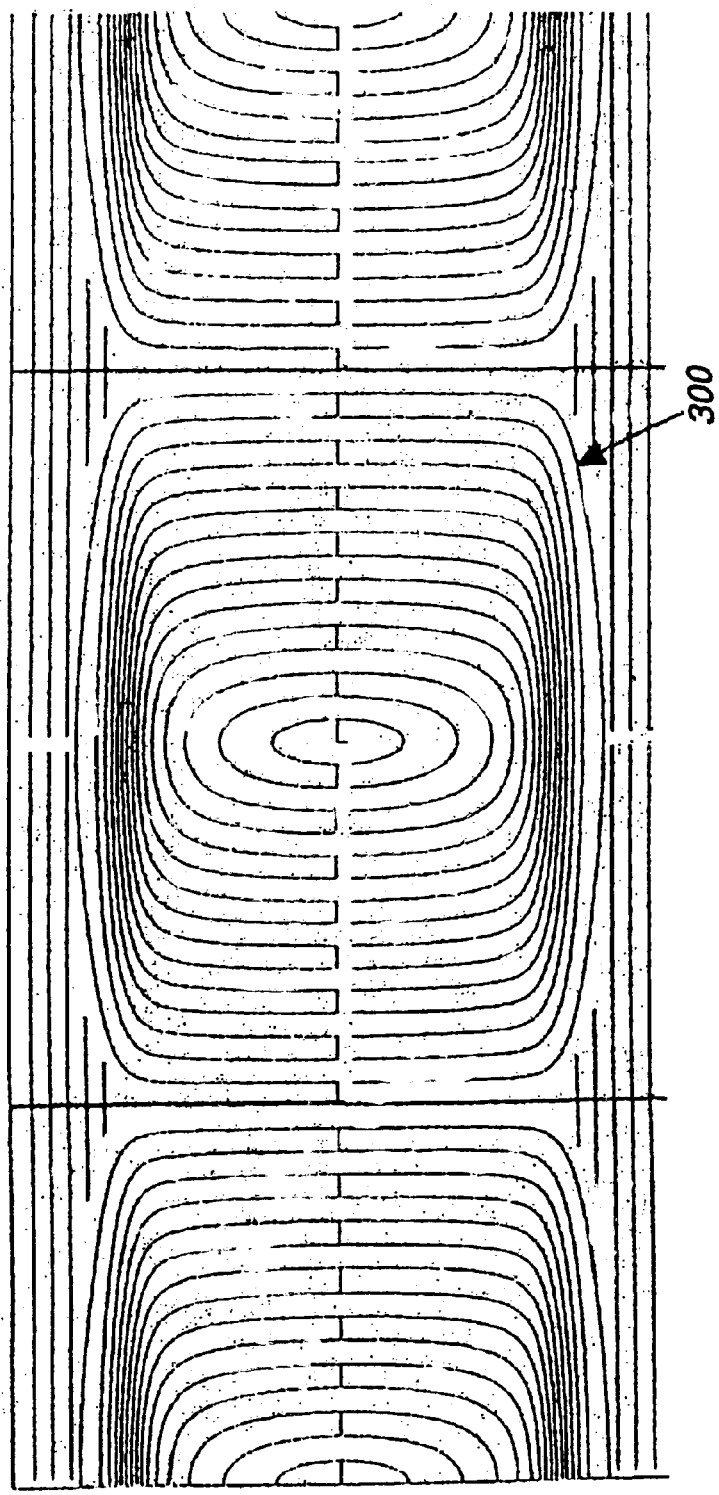
FIG. 3 is a representative illustration of a RF coil shield assembly wrapped on a cylindrical surface useful in embodiments of the present invention; and, FIGS. 4 and 5 are illustrations of a RF coil assembly to which embodiments of the present invention are applicable.

Referring to FIG. 3, a RF coil shield assembly is provided that is placed in close proximity to the RF coil assembly of FIG. 2. RF coil shield assembly 300, as shown in FIG. 3, is wrapped on a cylindrical surface and is adapted to reduce the inductance of the conductors contained within the RF coil assembly. An example of a RF coil shield assembly useful in this embodiment is described by U.S. Pat. No. 4,871,969 to Roemer et al.

In an exemplary embodiment, a whole body shielded birdcage coil was designed for a 94 cm bore 3 Tesla magnet (e.g. Magnex Scientific 3 T/94) fitted with GE Cardiac Resonance Module (CRM) gradient coils with a 60 cm inner diameter (I.D.). The birdcage coil is built on a 55 cm I.D. (55.7 cm outer diameter) fiberglass tube and has 16 conductors. The length of the conductors was 50 cm to reduce RF drive power and minimize conductor inductance. The conductors were also made very wide (7.9 cm with a gap of about 3 cm between conductors) to further reduce inductance and yield higher capacitor values. The birdcage antenna was built at 564 mm diameter inside a 600 mm segmented RF shield. This close shield spacing requires higher current to produce the $B_1$ but further reduced rung inductance yielding higher capacitor values of approximately 40 pf for a 128 MHz 3 Tesla scanner. The coil has an unloaded Quality Factor (Q, reactance to resistance ratio) a of 236 and loaded Q of around 47. The RF coil assembly was connected to a 90 degree quadrature hybrid power splitter and driven by a 25 KW tube type RF amplifier (e.g., Astex Inc.). Pin diode disable circuits were employed in 8 locations for deresonating the coil during headcoil and receive surface coil operation.

The coil produced a $B_1$ field with a uniformity of +−10% over 20 cm diameter of spherical volume (DSV) and +−30% over 35 cm DSV as measured in air with a field probe. It was found that 12 KW of input RF power produced a 14.7 uT 180 degree pulse in 3.2 uSin a salt loader phantom. Load impedance varied between 40 and 80 ohms for various patient weights from 120 to 310 lbs. Images of the spine, heart, wrist, and abdomen were acquired with good results. The coil has an inherent efficiency of approximately 75%.

The embodiment discussed above is a high pass RF coil assembly. Further embodiments include a band pass RF coil assembly and a low pass RF coil assembly. In a band pass RF coil assembly, conductors 210 are adapted to include capacitors, such as capacitive elements 220 of FIG. 2. Capacitive elements are also used as discussed above to electrically interconnect the conductors to form the RF coil assembly. A band pass configuration is desirably suitable in frequency ranges greater than about 200 MHz. A low pass embodiment comprises no end ring capacitive elements and conductors 210 are adapted to be constructed of capacitive elements.

It is to be appreciated that whole body RF coil assembly in a 3 T system will allow the use of virtually all whole body clinical application facilitated by a standard whole body 1.5 T system. Despite the aggressively short length of the coil, the limitation in FOV was primarily due to the Z gradient coil in the sagittal and coronal images. The peak and average power required to run standard image protocols although higher than 1.5 T systems is very reasonable and within current limits set by the FDA. 3 Tesla whole body systems provide a potential to have significant increase in image quality and resolution in high resolution applications such as cardiac, spine and extremity imaging.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A radio frequency (RF) coil assembly for imaging a subject volume using a very high field Magnetic Resonance Imaging (MRI) system comprising:

a plurality of conductors arranged cylindrically and disposed about a patient bore tube of the MRI system;

a plurality of capacitive elements disposed between and connecting respective ends of said conductors, said plurality of conductors and plurality of capacitive elements forming a high band pass birdcage configuration; and, a plurality of separating devices disposed between said capacitive elements and said patient bore tube to maintain a spaced apart relationship between respective capacitive elements and said patient bore tube.

2. The RF coil assembly of claim 1 wherein said separating devices comprises at least one of spacers constructed from dielectric material, mechanical spacers, and gaps formed by air between said capacitive elements and said patient bore tube.

3. The RF coil assembly of claim 1 wherein said very high field MRI system produces a magnetic field of about 3 Tesla (3 T).

4. The RF coil assembly of claim 1 wherein said plurality of conductors have a width selected for said RF coil assembly to resonate at substantially high frequencies.

5. The RF coil assembly of claim 4 wherein said substantially high frequencies occur in a range between about 64 MHz to about 500 MHz.

6. The RF coil assembly of claim 1 wherein said capacitive elements are low inductance end ring capacitors.

7. The RF coil assembly of claim 1 wherein an inner diameter of said patient bore tube is suitable for imaging a human body.

8. The RF coil assembly of claim 7 wherein said inner diameter is about 55 cm to about 60 cm.

* * * * *